(12) United States Patent
Zhang (10) Patent No.: US 9,331,188 B2
(45) Date of Patent: May 3, 2016

(54) SHORT-CIRCUIT PROTECTION CIRCUITS, SYSTEM, AND METHOD

(71) Applicant: Avago Technologies General IP (Singapore) Pte. Ltd., Singapore (SG)

(72) Inventor: Bin Zhang, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/483,846

(22) Filed: Sep. 11, 2014

(65) Prior Publication Data

US 2016/0079401 A1    Mar. 17, 2016

(51) Int. Cl.

| | |
|---|---|
| *G11C 5/06* | (2006.01) |
| *H03K 17/16* | (2006.01) |
| *H03K 17/56* | (2006.01) |
| *H03K 17/567* | (2006.01) |
| *H02H 3/08* | (2006.01) |
| *H02H 9/02* | (2006.01) |
| *H01L 29/739* | (2006.01) |
| *H01L 27/02* | (2006.01) |

(52) U.S. Cl.
CPC ........ *H01L 29/7393* (2013.01); *H01L 27/0259* (2013.01); *H01L 27/0288* (2013.01); *H01L 27/0292* (2013.01); *H02H 3/08* (2013.01); *G11C 5/06* (2013.01); *H01L 2924/00* (2013.01); *H02H 9/02* (2013.01); *H02H 9/025* (2013.01); *H03K 17/56* (2013.01); *H03K 17/567* (2013.01)

(58) Field of Classification Search
CPC .. H01L 2924/00; H03K 17/56; H03K 17/567; H02H 3/08; H02H 9/02; H02H 9/025

USPC ........ 365/177; 327/109; 361/93.1, 93.7, 93.9, 361/100

See application file for complete search history.

(56) References Cited

U.S. PATENT DOCUMENTS

| | | |
|---|---|---|
| 5,444,591 A | 8/1995 | Chokhawala et al. |
| 5,761,246 A | 6/1998 | Cao et al. |
| 7,095,788 B1 | 8/2006 | Cao et al. |
| 7,110,681 B1 | 9/2006 | Mizuochi |
| 7,113,550 B2 | 9/2006 | Stonecypher et al. |
| 7,308,058 B2 | 12/2007 | Zerbe et al. |
| 7,408,755 B1 * | 8/2008 | Ye et al. ...................... 361/93.1 |
| 7,447,278 B2 | 11/2008 | Menolfi et al. |
| 7,463,079 B2 | 12/2008 | De et al. |
| 8,385,439 B2 | 2/2013 | Djordjevic et al. |
| 2001/0015709 A1 | 8/2001 | Imajo |

(Continued)

FOREIGN PATENT DOCUMENTS

CN          203481816          3/2014

OTHER PUBLICATIONS

Dulau et al., "A New Gate Driver Integrated Circuit for IGBT Devices with Advanced Protections", IEEE Transactions on Power Electronics, vol. 21, No. 1, Jan. 2006, 7 pages.

(Continued)

*Primary Examiner* — Ly D Pham (57) ABSTRACT

Systems, circuits, and methods for protecting an Insulated-Gate Bipolar Transistor (IGBT) from short-circuit events are provided. A short-circuit protection circuit is described that includes a switch, a resistor, a capacitor, and an optional current buffer that provide a strong pull-down to the IGBT in response to detecting a short-circuit event and then controls a rate at which turn-off current is decreased, thereby minimizing a peak voltage for the IGBT.

20 Claims, 12 Drawing Sheets

(56) References Cited

U.S. PATENT DOCUMENTS

| | | | |
|---|---|---|---|
| 2004/0027762 A1* | 2/2004 | Ohi et al. | 361/100 |
| 2004/0141569 A1 | 7/2004 | Agazzi | |
| 2006/0111074 A1 | 5/2006 | Petilli et al. | |
| 2007/0025283 A1 | 2/2007 | Koslov | |
| 2007/0252565 A1* | 11/2007 | Wang et al. | 323/277 |
| 2008/0304197 A1* | 12/2008 | Higashi | 361/93.7 |
| 2009/0051675 A1 | 2/2009 | Huang | |
| 2010/0119007 A1 | 5/2010 | Kawahara | |
| 2011/0158654 A1 | 6/2011 | Zhang | |
| 2011/0284507 A1 | 11/2011 | Deladurantaye | |
| 2012/0016650 A1 | 1/2012 | Hollis | |
| 2012/0206174 A1* | 8/2012 | Maruyama et al. | 327/109 |
| 2012/0218669 A1 | 8/2012 | Ioannidis et al. | |
| 2012/0321323 A1 | 12/2012 | Huang et al. | |
| 2013/0128943 A1 | 5/2013 | Doron | |
| 2013/0241622 A1 | 9/2013 | Zerbe et al. | |
| 2014/0192449 A1 | 7/2014 | Shimizu | |
| 2014/0218833 A1 | 8/2014 | Wu et al. | |
| 2015/0071651 A1 | 3/2015 | Asmanis | |
| 2015/0249501 A1 | 9/2015 | Nagarajan | |

OTHER PUBLICATIONS

Official Action for U.S. Appl. No. 14/020,399, mailed Dec. 22, 2014.

Cho et al. "Design of Integrated IGBT Gate Drive with SOA Consideration," Eresnews, Feb. 2000, vol. 15, No. 1, 2 pages [retrieved from: http://www.eng.nus.edu.sg/EResnews/0002/rh/rh_pg_12/rh-eel.htm].

DYBKO "Fiber optic chemical sensors," Chemical Sensors Research Group, 2005, 9 pages [retrieved from: http://csrg.ch.pw.edu.pl/tutorials/fiber/].

Semikron "Connection of Gate Drivers to IGBT and Controller," PowerGuru, Jul. 24, 2012, 6 pages [retrieved from: http://www.powerguru.org/connection-of-gate-drivers-to-igbt-and-controller/].

* cited by examiner

SHORT-CIRCUIT PROTECTION CIRCUITS, SYSTEM, AND METHOD

FIELD OF THE DISCLOSURE

The present disclosure is generally directed toward IGBT driver circuits and short-circuit protection circuits.

BACKGROUND

The Insulated-Gate Bipolar Transistor (IGBT) is a three-terminal power semiconductor device primarily used as an electronic switch and in newer devices is noted for combining high efficiency and fast switching. It switches electric power in many modern appliances such as: Variable-Frequency Drives (VFDs), electric cars, trains, variable speed refrigerators, lamp ballasts, air-conditioners, and even stereo systems with switching amplifiers.

IGBTs are often used for high voltage (e.g., greater than 600V) and high-current power converter applications. In these types of applications, a short-circuit of the load wire to a power source will result in a large current flowing through the IGBT, which is likely to damage the IGBT. Because of the potential for damage to IGBTs, gate drive circuits must detect IGBT short-circuit conditions and turn off the IGBT safely to prevent damage to the IGBT.

Figure 1:
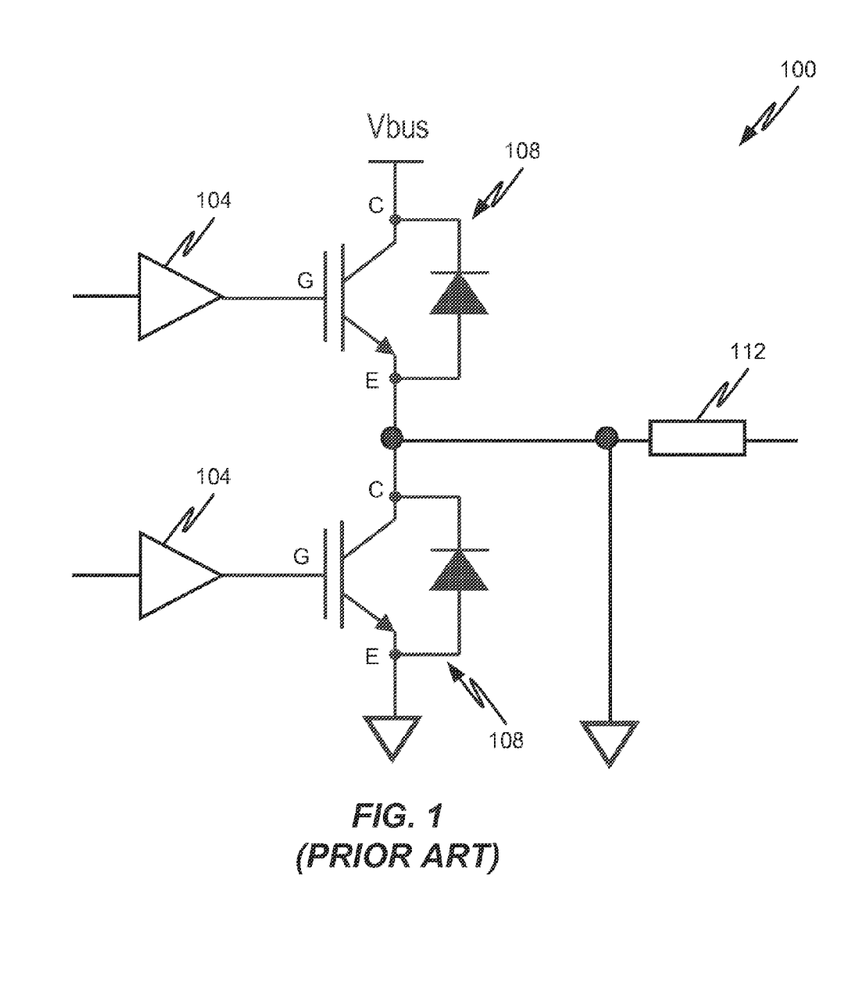
FIG. 1 is a circuit diagram depicting a first prior art circuit.

A common IGBT drive circuit 100 without short-circuit protection is shown in FIG. 1 where a load 112 is driven by current from IGBTs 108, which are in turn driven by gate drivers 104. The depicted circuit 100 is often referred to as a half-bridge circuit and is among the most important circuit configurations for power drives. The circuit 100 is shown to include two IGBTs 108 connected to one another at the circuit's 100 midpoint and the load 112 is connected to this midpoint. The midpoint corresponds to a circuit node where an emitter E of one IGBT 108 is connected to a collector C of another IGBT 108.

Problematically, as shown in FIG. 1, if the circuit 100 experiences a short (e.g., between Ground/common voltage and the circuit's 100 midpoint) then excessive current will flow through the top IGBT 108, most likely resulting in damage to the IGBT.

Figure 2:
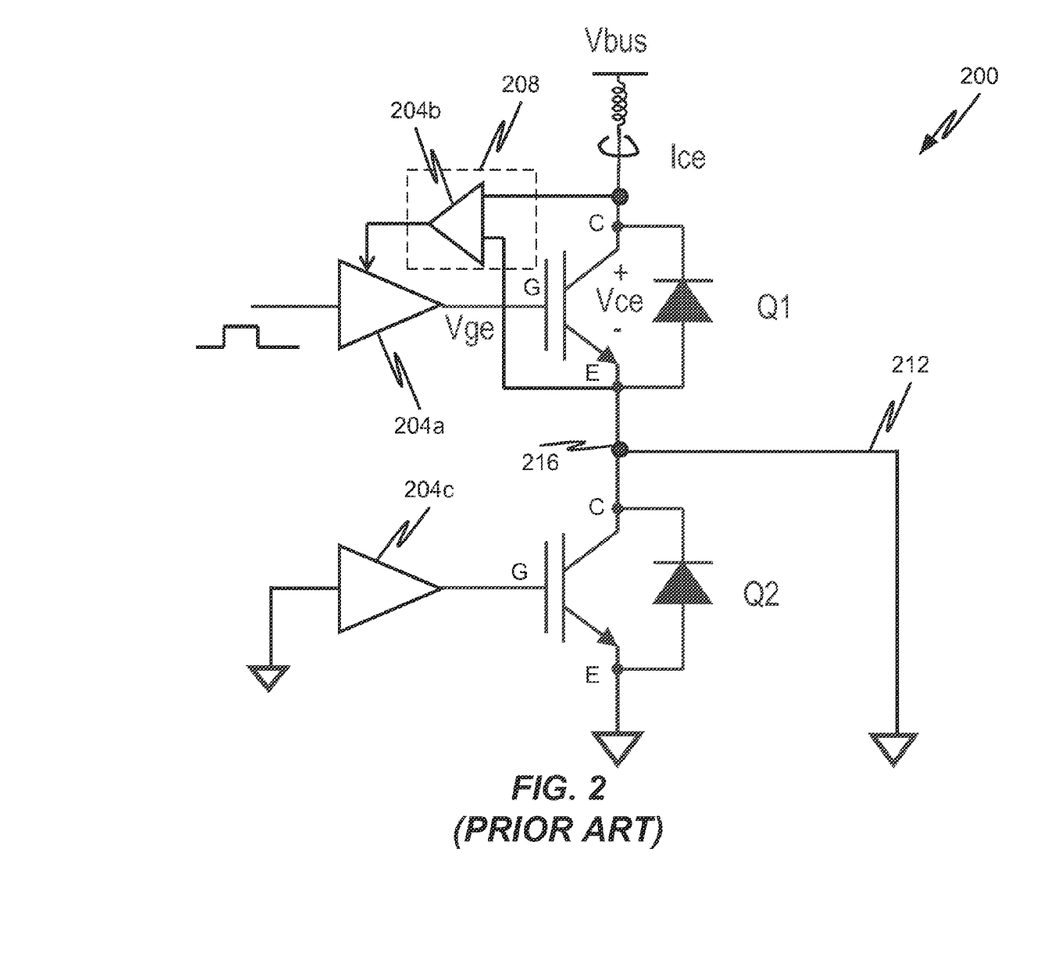
FIG. 2 is a circuit diagram depicting a second prior art circuit.

FIG. 2 depicts an illustrative circuit 200 that includes a short-circuit detection circuit 208 that enables the detection of a short-circuit event that could potentially damage the first IGBT Q1 in the circuit 200. It should be appreciated that the first IGBT Q1 may correspond to the same or similar component as the IGBT 108 depicted in FIG. 1. Similarly, the second IGBT Q2 depicted in circuit 200 may correspond to the same or similar component as the IGBT 108 depicted in FIG. 1.

As in FIG. 1, the circuit 200 is configured in a half-bridge configuration where a first driver 204a is driving the first IGBT Q1 and a second driver 204c is driving the second IGBT Q2. The short-circuit detection circuit 208 is shown to include a second driver 204b that senses the collector-to-emitter voltage Vce for the first IGBT Q1. An output of the second driver 204b provides information back to the first driver 204a such that if the short-circuit detection circuit 208 detects a short-circuit event. Most often, the short-circuit event that is detected by the short-circuit detection circuit 208 corresponds to a short between the midpoint 216 of the half-bridge circuit and ground. When such a condition is detected, the second driver 204b provides a signal to the first driver 204a that causes the first driver 204a to turn off. The second driver 204a is turned off in an effort to protect the first IGBT Q1 from overheating and/or damage due to increased current flowing from the collector C to the emitter E (known as collector-to-emitter current Ice).

During short-circuit protection test in circuit 200 for a short-circuit event, the third driver 204c is kept inactive, thereby keeping the bottom side of the second IGBT Q2 off. It should be appreciated that while circuit 200 is shown as including two IGBTs Q1, Q2, a circuit with a greater or lesser number of IGBTs may benefit from short-circuit detection and protection techniques.

Figure 3:
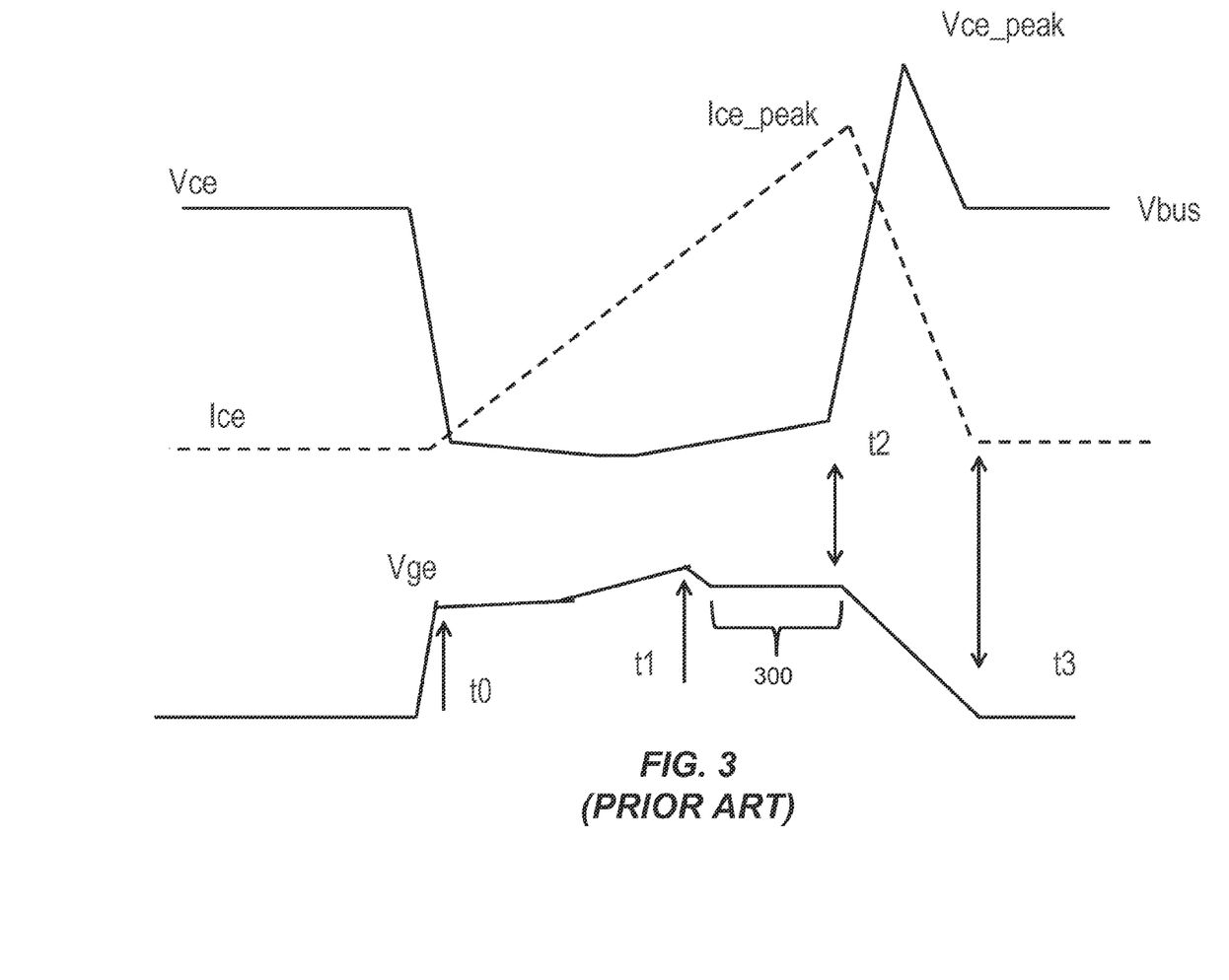
FIG. 3 is a timing diagram depicting current and voltage waveforms produced in the circuit of FIG. 2 during a short-circuit event.

FIG. 3 shows the current waveforms when a short-circuit event is detected by the short-circuit detection circuit 208 and the first driver 204a is subsequently turned off. In particular, during a short-circuit turn-off process, the first driver 204a initially turns on the first IGBT Q1 at time t0. At a point in time thereafter, the first IGBT Q1 enters into a short-circuit event and the collector-to-emitter current Ice rises rapidly. At time t1 the short-circuit detection circuit 208 detects the high collector-to-emitter voltage Vce and triggers a short-circuit shutdown. In response to the short-circuit shutdown, the gate-to-emitter voltage Vge begins to decrease. The rising collector-to-emitter voltage Vce generates a Miller current through the collector-to-gate capacitance Cgc of the first IGBT Q1. This Miller current injected into the gate G of the first IGBT Q1 generates a Miller plateau on the gate-to-emitter voltage Vge.

At time t2, the Miller current reduces as the Miller capacitance Cgc reduces rapidly with the higher reverse biasing of the gate-to-collector voltage Vgc. This, in turn, causes the gate-to-emitter voltage Vge to start decreasing again to turn off the first IGBT Q1. This results in the collector-to-emitter current Ice decreasing sharply with the quick fall in the gate-to-emitter voltage Vge. The sudden decrease in the collector-to-emitter current Ice and parasitic wire inductance Ls induces a spike in the collector-to-emitter voltage Vce, which ultimately causes the collector-to-emitter voltage Vce to reach a maximum value Vce_peak.

At time t3, the gate-to-emitter voltage Vge reaches the first IGBT's Q1 turn-off threshold, thereby reducing the collector-to-emitter current Ice to zero. This allows the collector-to-emitter voltage Vce to settle down to the terminal bus voltage Vbus and the turn-off process ends.

With the above in mind, circuit designers looking to utilize IGBTs have two primary concerns. First, the peak collector-to-emitter voltage Vce_peak should be less than the IGBT specified breakdown voltage (e.g., 650V). Second, the IGBT can only tolerate limited short circuit durations, which means that the duration of time between time t0 and time t3 should be less than a specified time for the IGBT (e.g., 10 us). To date many system trade-offs have to be made in order to simultaneously maintain the collector-to-emitter voltage Vce below a reasonable threshold while minimizing the short-circuit duration (e.g., the time between t0 and t3).

BRIEF DESCRIPTION OF THE DRAWINGS

The present disclosure is described in conjunction with the appended figures, which are not necessarily drawn to scale.

DETAILED DESCRIPTION

It is with respect to the above-noted challenges that embodiments of the present disclosure were contemplated. In particular, a system, circuits, and method of operating such circuits are provided that solve the drawbacks associated short-circuit protection circuits of the prior art.

While embodiments of the present disclosure will primarily be described in connection with short-circuit protection circuits for IGBTs or circuits containing IGBTs, it should be appreciated that embodiments of the present disclosure are not so limited.

Various aspects of the present disclosure will be described herein with reference to drawings that are schematic illustrations of idealized configurations. It should be appreciated that while particular circuit configurations and circuit elements are described herein, embodiments of the present disclosure are not limited to the illustrative circuit configurations and/or circuit elements depicted and described herein. Specifically, it should be appreciated that circuit elements of a particular type or function may be replaced with one or multiple other circuit elements to achieve a similar function without departing from the scope of the present disclosure.

It should also be appreciated that the embodiments described herein may be implemented in any number of form factors. Specifically, the entirety of the circuits disclosed herein may be implemented in silicon as a fully-integrated solution (e.g., as a single Integrated Circuit (IC) chip or multiple IC chips) or they may be implemented as discrete components connected to a Printed Circuit Board (PCB).

Figure 4:
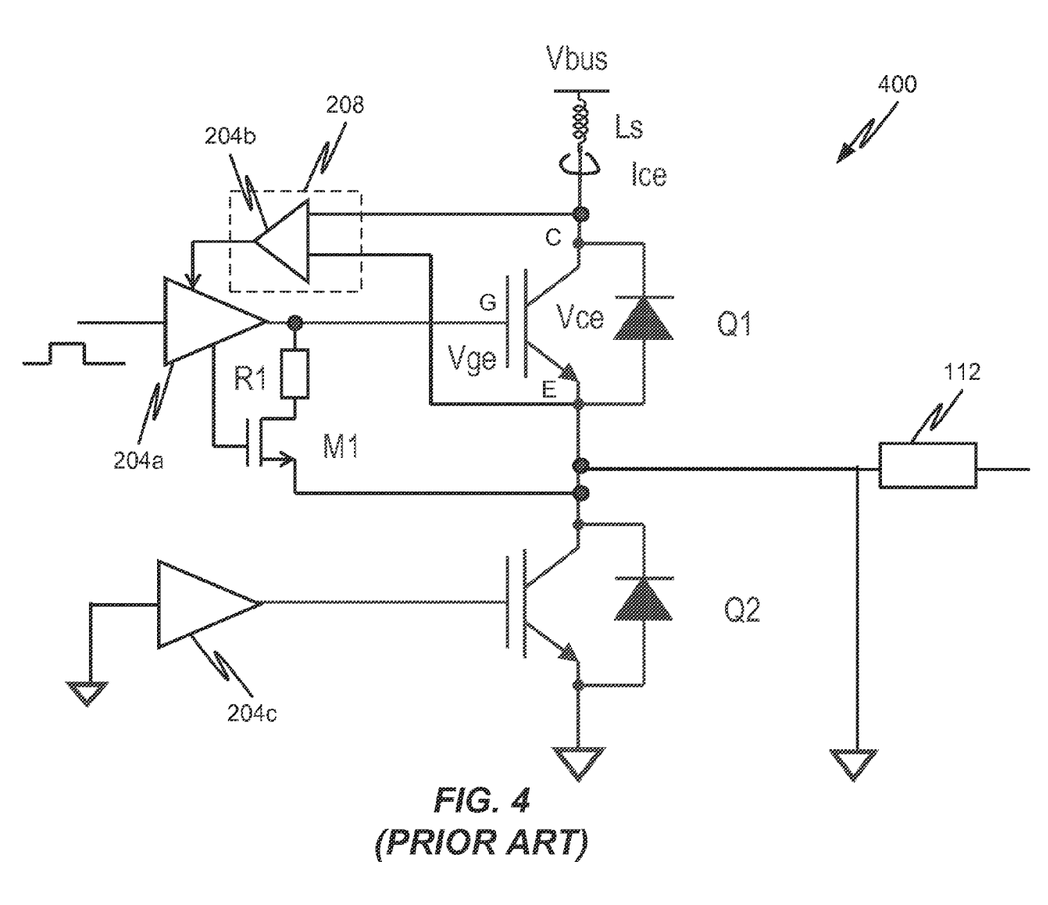
FIG. 4 is a circuit diagram depicting a soft shut-down circuit as is known in the prior art.
Figure 5:
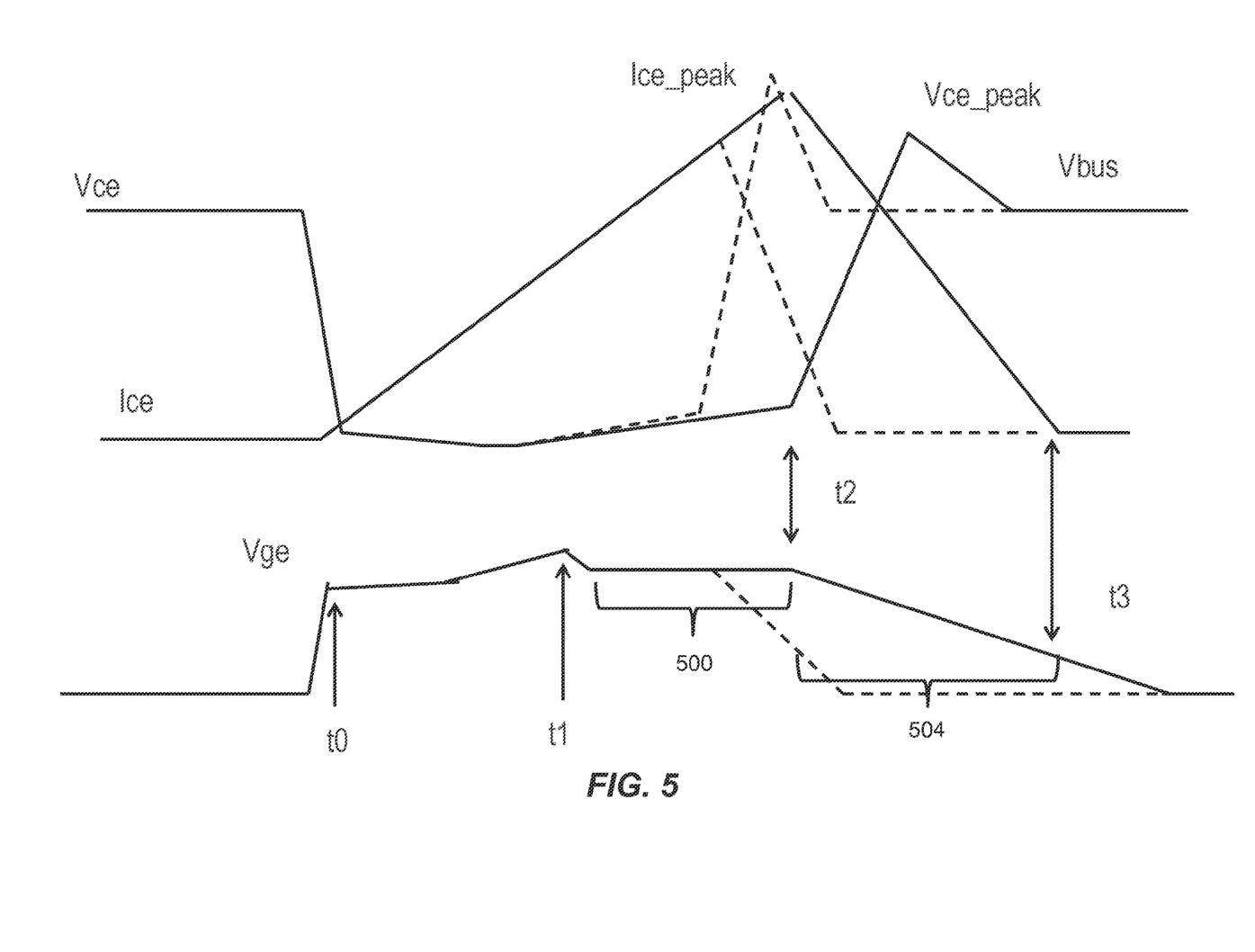
FIG. 5 is a timing diagram depicting current and voltage waveforms produced in the circuit of FIG. 4 during a short-circuit event.

With reference now to FIGS. 4 and 5, a soft shut-down circuit 400 is depicted. The soft shut-down circuit 400 is shown to include two IGBTs Q1, Q2 in a half-bridge configuration in which a load 112 can be driven. Non-limiting examples of the load 112 can include VFD motors, electric car motors, train motors, industrial motors, variable speed refrigerator motors, lamp ballasts, air-conditioners, and/or stereo systems with switching amplifiers Like other driver circuits of the prior art, the circuit 400 includes a short-circuit detection circuit 208. It should be appreciated that any type of detection circuit known in the art can be used to detect a short-circuit event at the IGBT Q1. The short-circuit detection circuit 208 is merely used as an illustrative circuit and for ease of discussion.

The soft shut-down circuit 400 utilizes a resistor R1 and switch M1 to extend the turn-off time 504 (e.g., the time between time t2 and t3), thereby decreasing the peak voltage Vce_peak. In particular, since Vce_peak=(Ls*Ice_peak/(t3−t2))+Vbus, it is possible to decrease the Vce_peak for the first IGBT Q1 if the turn-off time 504 is increased. The other components of Vce_peak (e.g., Ls, Ice_peak, and Vbus) are determined by either system constraints or application requirements and are, therefore, not usually available to alteration.

The soft shut-down circuit 400 achieves the desirable goal of reducing Vce_peak by providing an alternative current path, which provides a weak pull-down of the gate G of the first IGBT Q1. Specifically, when a short-circuit event is detected by the short-circuit detection circuit 208, the switch M1 is turned on while the first driver 204a is turned off. This causes current to flow through resistor R1 and switch M1.

Although switch M1 is depicted as corresponding to an NMOS transistor, it should be appreciated that any switching component or collection of components can be utilized without departing from the scope of the present disclosure.

FIG. 5 depicts the waveforms (current and voltage) experienced during a soft shut-down achieved with the circuit 400 (in solid lines) as compared to a normal shut down achieved with the circuit 200 (in dotted lines). Due to the weak pull-down set by resistor R1, the gate turn-off time 504 (e.g., time between t2 and t3) increases and the rate at which current Ice also decreases (e.g., has a smaller slope). As a result of this weak pull-down, the peak voltage Vce_peak is decreased as compared to the waveform achieved without the switch M1 and resistor R1. However, the length of the Miller plateau 500 increases because more time is required to charge the Miller capacitance Cgc due to a larger resistor R1.

In short, the soft shut-down achieves the desirable effect of reducing the peak voltage Vce_peak at the expense of increasing the short circuit duration (e.g., time between t0 and t3). For smaller IGBTs (e.g., IGBTs rated to handle less than 500V), this is likely not a problem as there is plenty of timing margin and extended durations of shutdown time can be tolerated. For larger power IGBTs, however, the soft shut-down circuit 400 can be too weak to timely turn off the IGBT.

Figure 6:
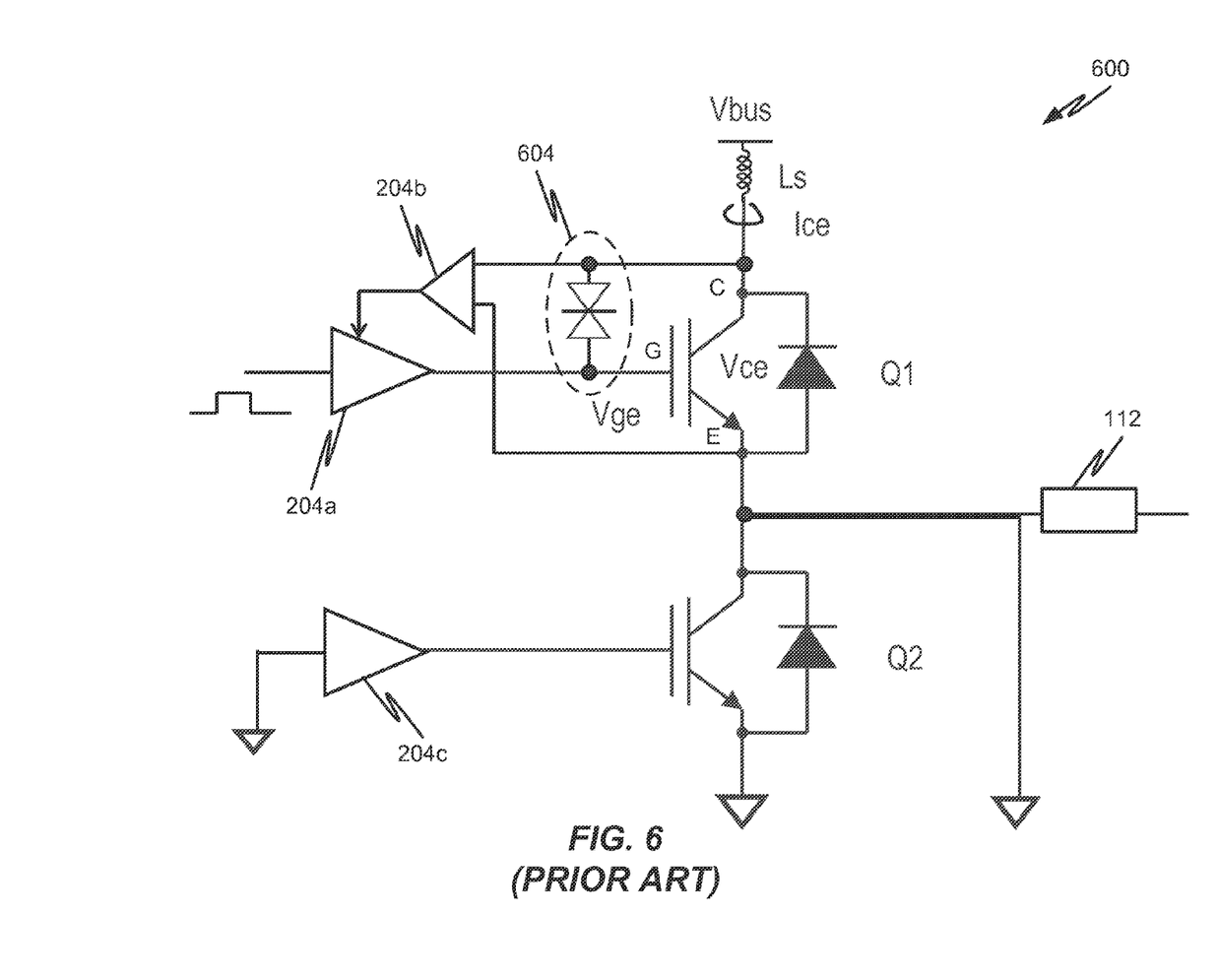
FIG. 6 is a circuit diagram depicting a hard shut-down circuit with an active clamping diode as is known in the prior art.
Figure 7:
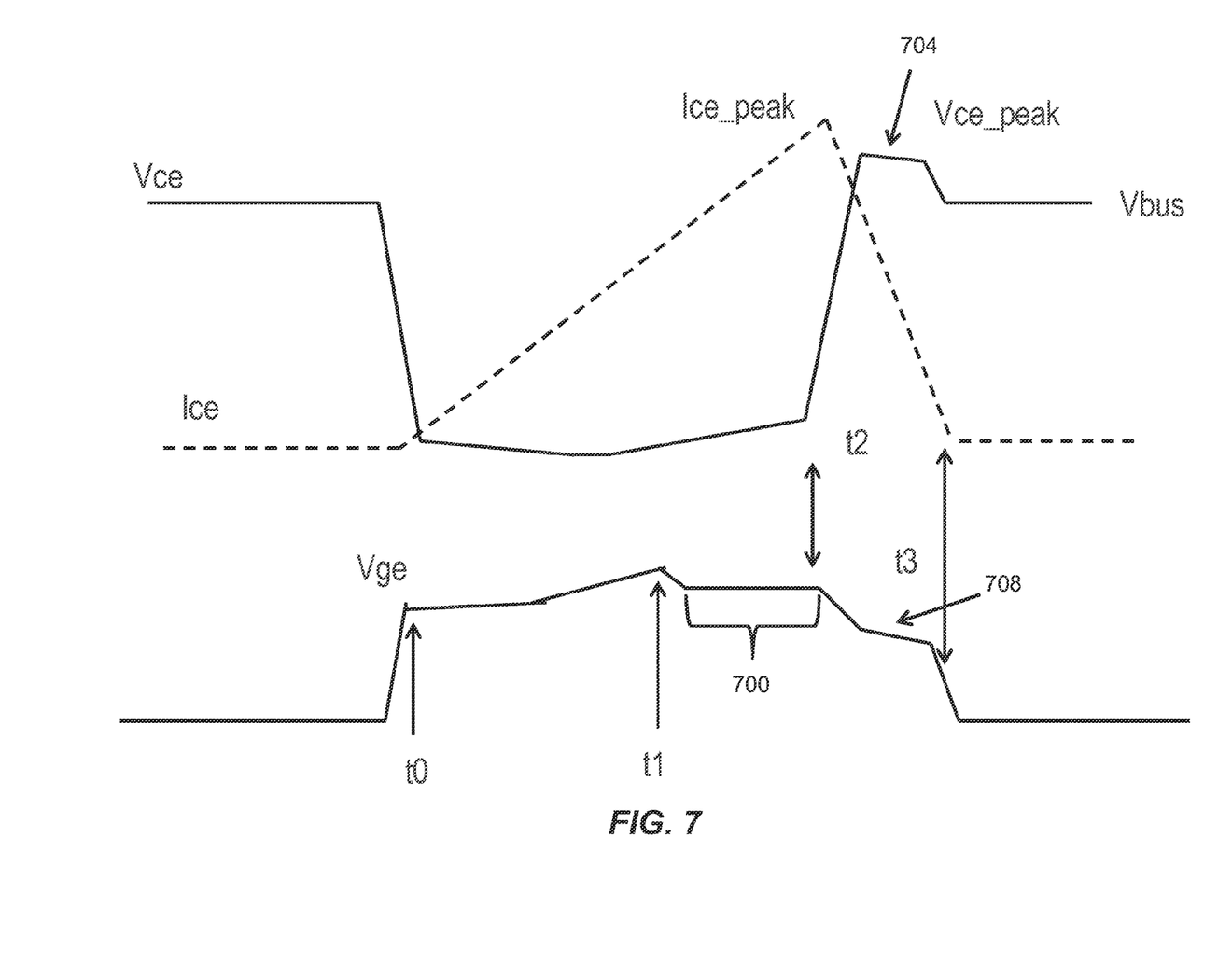
FIG. 7 is a timing diagram depicting current and voltage waveforms produced in the circuit of FIG. 6.

With reference now to FIGS. 6 and 7 a hard shut-down circuit 600 having an active clamping diode is depicted. For larger power IGBTs, the design priority is to keep the short-circuit shut-down time within a specified duration. Due to the larger IGBT loading, hard shut-down is often used to keep the Miller plateau 700 short to meet shut-down time requirements and lower the peak current Ice_peak. However, turning off the IGBT too fast during a short-circuit event may result in higher a higher peak voltage Vce_peak, which could also break down the IGBT.

Accordingly, a hard shut-down circuit 600 as shown in FIG. 6 can be utilized. Specifically, a Transient Voltage Supressor (TVS) diode 604 that is connected between the gate G and collector C of the first IGBT Q1. The TVS diode 604 is also positioned between one input of the second driver 204b and the gate G of the first IGBT Q1. The TVS diode 604 provides the circuit 600 with the ability to prevent IGBT breakdown during a short-circuit event. When a short-circuit event is detected, the first IGBT Q1 is initially turned off at time t1. Thereafter, the Miller current begins flowing in the first IGBT Q1, resulting in the Miller plateau 700 that is kept short due to the initial strong pull down of the IGBT. After time t2, the voltage Vce begins rising rapidly; however, unlike the other shut-down circuits previously described, when the voltage Vce exceeds the breakdown voltage of the TVS diode 604, the first IGBT Q1 is turned back on to clamp the voltage Vce at a clamped voltage 704. This changes the slope at which voltage Vge is decreasing 708, thereby clipping the peak voltage Vce_peak.

Advantageously, the TVS diode 604 does not compromise the overall shutdown time (e.g., the time between t0 and t3) and keeps the Miller plateau 700 relatively short due to the initial strong pull-down. Also, the peak voltage Vce_peak is limited by breaking down the TVS diode 604 to slow down the turn-off of the first IGBT Q1 toward the end of the turn-off process. While the TVS diode 604 works well to protect the IGBT from the peak voltage Vce exceeding predetermined thresholds, the implementation of the TVS diode 604 reduces the effective working voltage of the IGBT. This means that if the IGBT is rated to work at 600V, then the introduction of the TVS diode 604 effectively limits the working voltage of the IGBT to a lesser voltage (e.g., 550V). Accordingly, for the same application, a higher-rated voltage IGBT has to be used, which increases the system cost and reduces the overall efficiency of the system.

With reference now to FIGS. 8-12, improved short-circuit protection circuit(s) are described which overcome the above-noted shortcomings. With initial reference to FIG. 8, a circuit 800 is depicted as having a short-circuit protection circuit 804 positioned between the gate G and emitter E of the first IGBT Q1. In particular, the short-circuit protection circuit 804 is connected to the emitter of first IGBT Q1, the gate G of the first IGBT Q1, and the first driver 204a. The short-circuit protection circuit 804 provides the circuit 800 with the ability to employ a hard shut-down during the Miller plateau 1000. This serves to keep the time between t1 and t2 relatively short and the peak current Ice_peak low. The short-circuit protection circuit 804 also enables the circuit 800 to slow down the turn-off of the first IGBT Q1 at the end of the Miller plateau 1000. By reducing the rate of change for the collector current Ice during turn-off 1004, the peak voltage Vce_peak is kept relatively lower than if a soft shut-down were employed.

Figure 8:
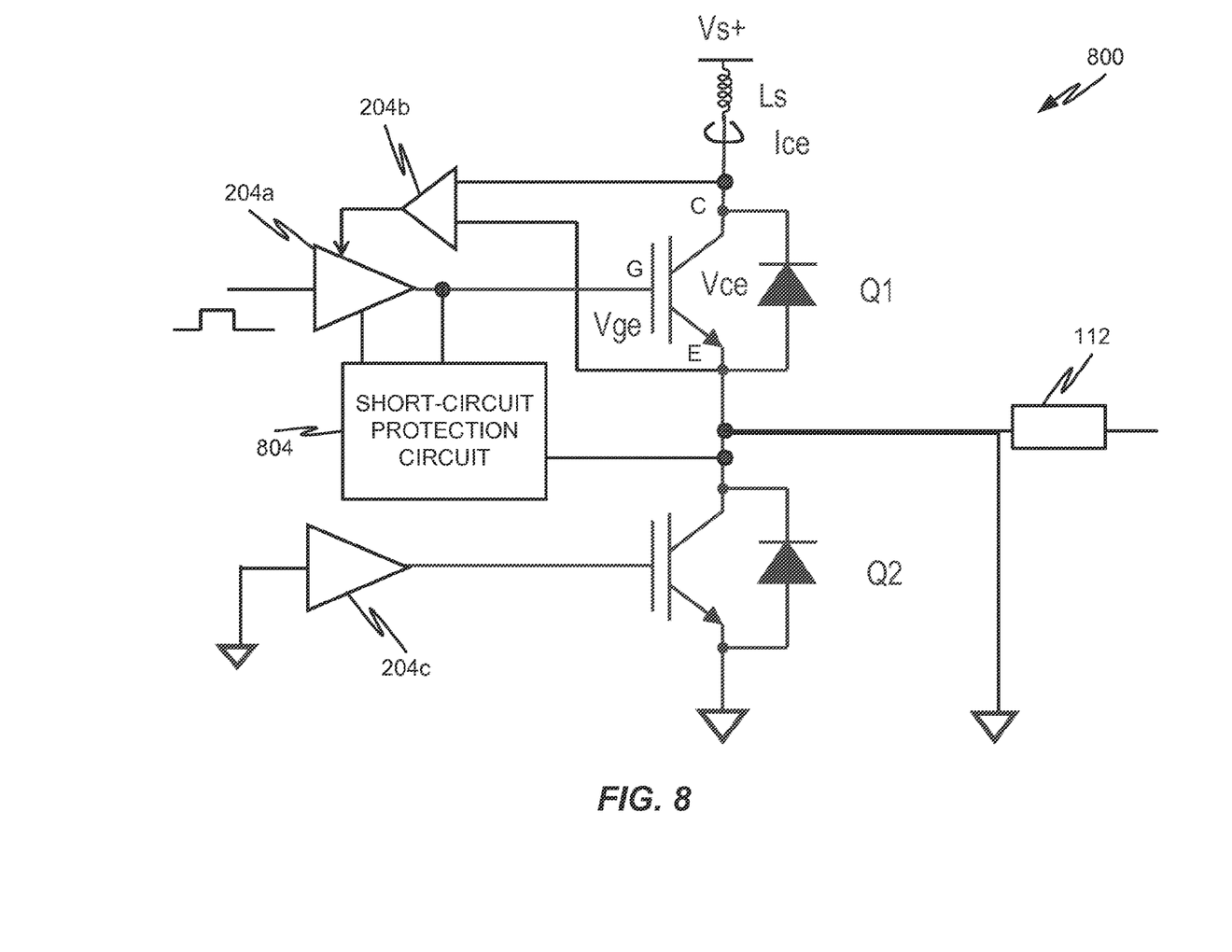
FIG. 8 is a circuit diagram depicting a circuit configuration in accordance with embodiments of the present disclosure.

The short-circuit protection circuit 804 enables both a short turn-off time and decreased peak voltage Vce_peak, thereby enabling the circuit 800 to better respond to short-circuit events detected by the second driver 204b without compromising the effective working voltage of the IGBT.

Figure 9:
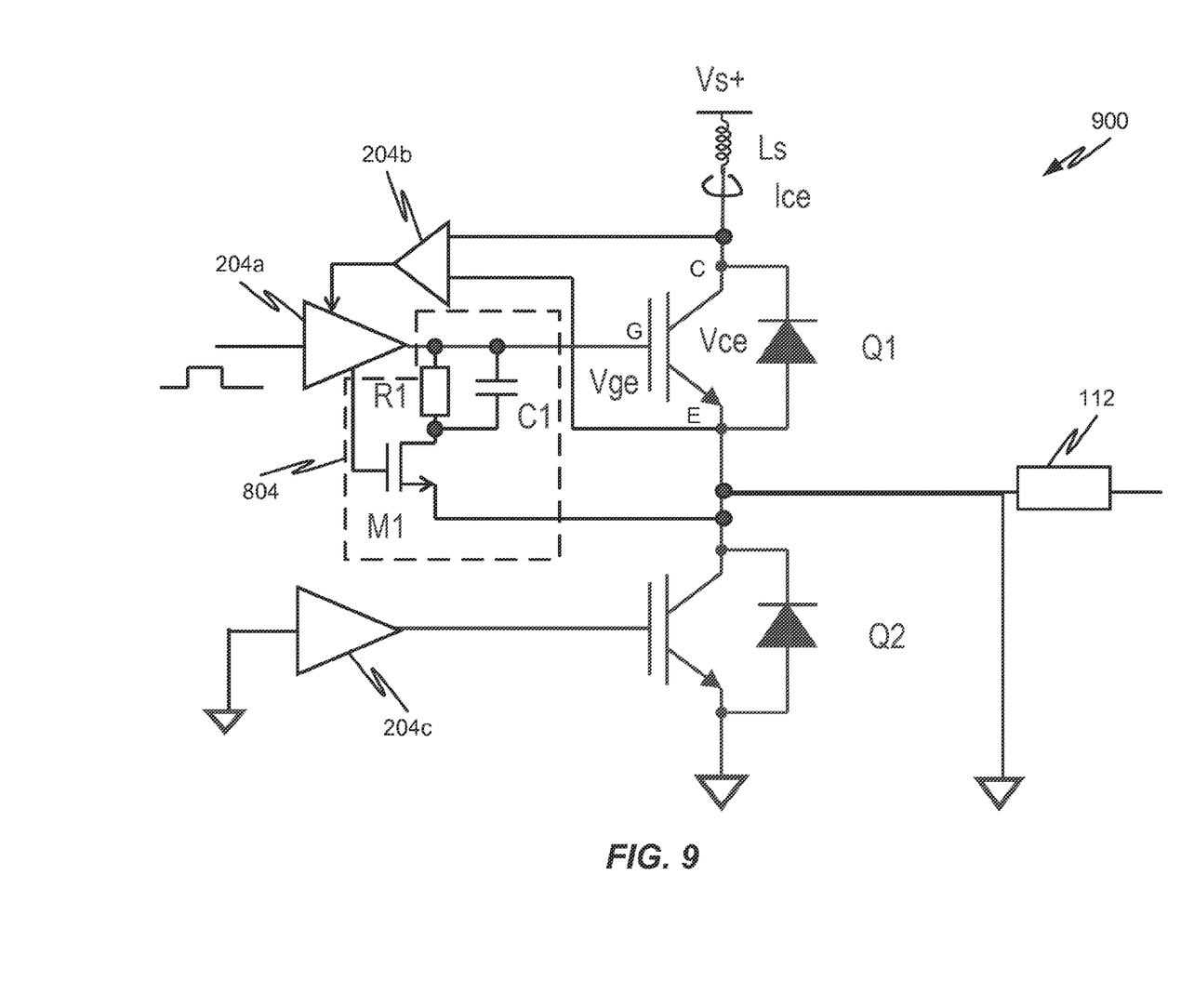
FIG. 9 is a circuit diagram depicting a first example of the short-circuit protection circuit in accordance with embodiments of the present disclosure.

FIG. 9 shows one example of a short-circuit protection circuit 804 in accordance with embodiments of the present disclosure. Specifically, the short-circuit protection circuit 804 is shown to include a capacitor C1 connected in parallel with a resistor R1. A first terminal of the capacitor C1 and a first terminal of the resistor R1 are commonly directly connected to a gate G node of the first IGBT Q1. Likewise, a second terminal of the capacitor C1 and a second terminal of the resistor R1 are commonly directly connected to an input of a switch M1. The switch M1 may correspond to an NMOS transistor, but it should be appreciated that a NPN or PNP transistor, or any other type of electrical component capable of performing electrical switching functions.

While the first terminal of the switch M1 is commonly connected to the second terminals of the resistor R1 and capacitor C1, a second terminal of the switch M1 is connected to the first driver 204a, and a third terminal of the switch M1 is connected to the emitter E of the first IGBT. The third terminal of the switch M1 may also be viewed as being connected to the midpoint of the half-bridge circuit created by the two IGBTs Q1, Q2.

Figure 10:
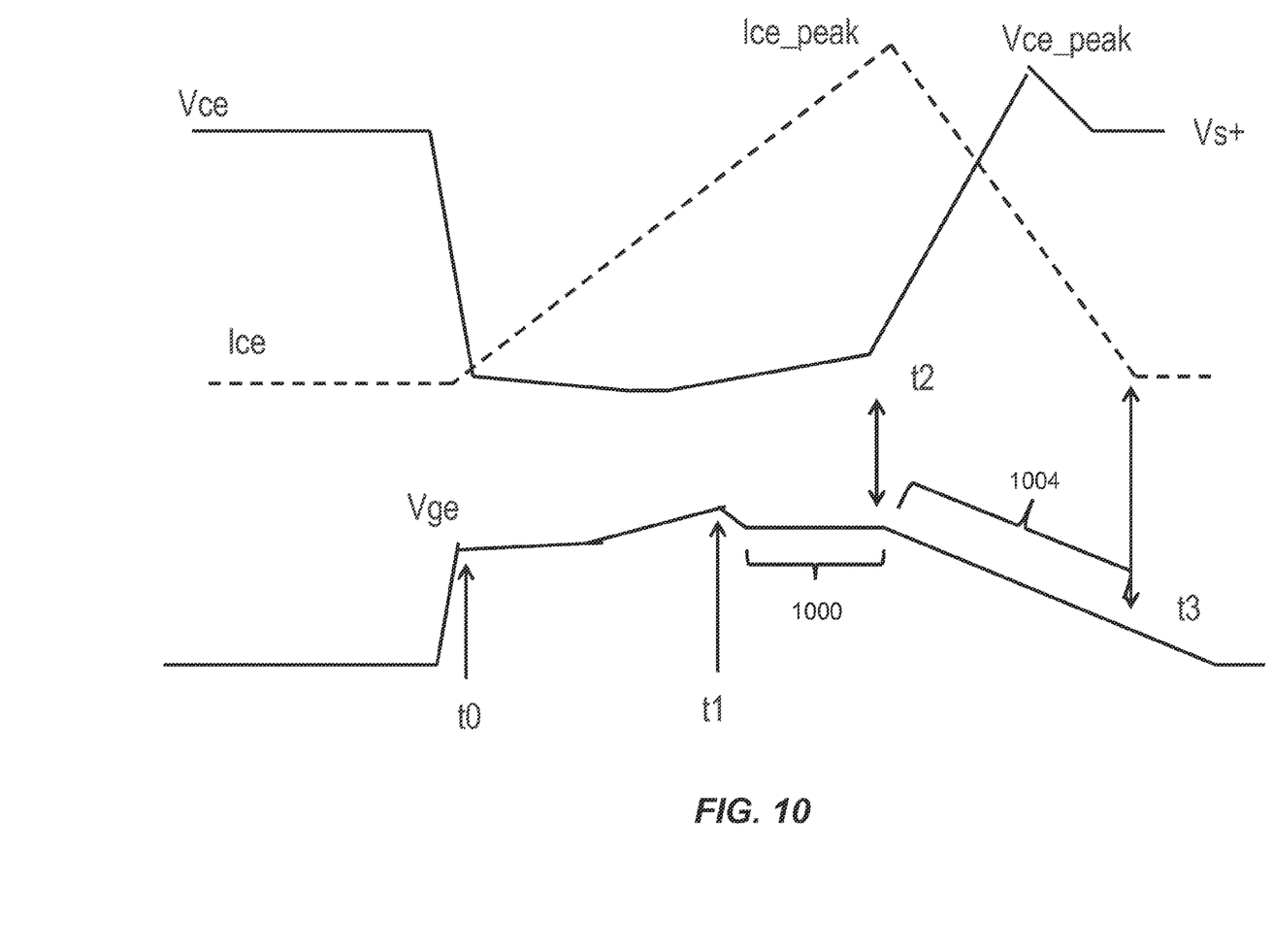
FIG. 10 is a timing diagram depicting current and voltage waveforms produced in the circuit of FIG. 9.

The short-circuit protection circuit 804 depicted in FIG. 9 facilitates the ability to implemented a strong pull-down in response to the detection of a short-circuit event by the second driver 204b. However, the capacitor C1 and resistor R1 also achieve the desirable effect of minimizing the amount of time that the IGBT Q1 is subjected to the short-circuit current. Specifically, when a short-circuit event is detected, the second driver 204b turns off the first driver 204a. At this point the switch M1 switches on to provide a strong pull-down. The resistor R1 is connected to program the turn-off current as well as set the turn-off time constant together with capacitor C1 and the gate-to-emitter capacitance Cge. During the strong pull-down (e.g., between time t1 and t2) the Miller plateau 1000 is maintained at a relatively short time (e.g., similar in duration to the Miller plateau 700 achieved with the hard shut-down circuit 600). Thereafter, the turn-off time 1004 (e.g., time between time t2 and t3) is increased due to the addition of the capacitor C1. This increased turn-off time occurs because the voltage Vge turn-off is determined by a R1*(C1+Cge) time constant. Thus, increasing the effective gate-to-emitter capacitance with the addition of capacitor C1 forces a slower turn-off time 1004. The increased turn-off time 1004 enables the circuit 900 to keep the peak voltage Vce_peak below a threshold value (e.g., similar to the peak voltage Vce_peak achievable with the hard shut-down circuit 600). In short, the behavior related to peak voltage Vce_peak and turn-off time are similar to that which is provided via implementation of a TVS diode 604. An advantage of circuit 900 as compared to the circuit 600, however, is that the effective working voltage of the IGBT is not decreased. Thus, an IGBT rated for 600V can be used in an application that requires 600V, whereas a larger IGBT would be needed for the same application if a TVS diode 604 were utilized.

Furthermore, the resistor R1 of the short-circuit protection circuit 804 is similar to the resistor R1 used in the soft shut-down, except in soft shut-down, the R1 is relatively large (e.g greater than 100 ohm). In the circuit 900, a relatively smaller resistor R1 (e.g., 10-50 ohms) is used to keep the Miller plateau 1000 short.

While the illustrative circuit 900 only depicts a single short-circuit protection circuit 804, it should be appreciated that multiple short-circuit protection circuits 804 can be incorporated into a circuit 900 without departing from the scope of the present disclosure. For instance, a second short-circuit protection circuit 804 may be implemented to protect the second IGBT Q2. Moreover, the circuit 900 may comprise more than two IGBTs to drive the load 112, in which case each of the additional IGBTs may, or may not, have a short-circuit protection circuit 804 provided therefor.

Figure 11:
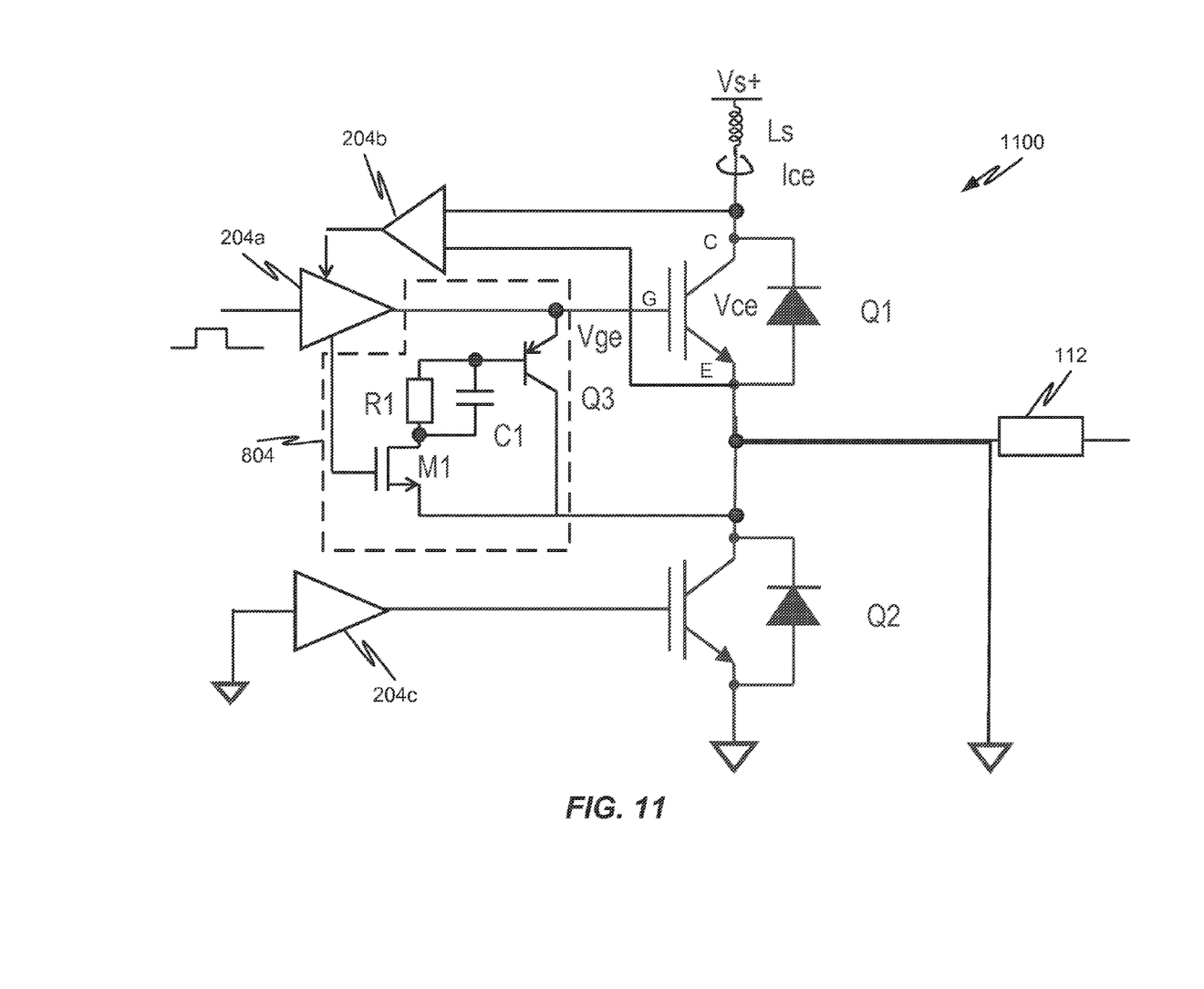
FIG. 11 is a circuit diagram depicting a second example of the short-circuit protection circuit in accordance with embodiments of the present disclosure.

FIG. 11 shows another example of a short-circuit protection circuit 804 in accordance with embodiments of the present disclosure. The circuit 1100 illustrated in FIG. 11 is similar to the circuit of FIG. 9 except that a current buffer Q3 is provided to boost the turn-off current and reduce the Miller plateau 1000 time further. The current buffer Q3 is shown as a PNP transistor, however, it should be appreciated that any type of switching component can be used for the current buffer Q3. In the depicted embodiment, a first terminal of the current buffer Q3 is connected to the gate G of the first IGBT Q1. A second terminal of the current buffer Q3 is connected to the first terminal of the resistor R1 and capacitor C1. Thus, the resistor R1 and capacitor C1 are not connected directly to the gate G of the first IGBT Q1 in this particular implementation. A third terminal of the current buffer Q3 is connected to the emitter E of the first IGBT Q1 or, said another way, the third terminal of the current buffer Q3 is connected to the emitter of first IGBT Q1. The relative configuration of the resistor R1 and capacitor C1 to the switch M1 remains the same as in circuit 900.

While circuit 1100 provides the same advantages as circuit 900, the circuit 1100 provides the additional advantage an amplified turn-off current to keep the Miller plateau 1000 duration (e.g., time between time t1 and t2) relatively small. On the other hand, the current buffer Q3 separates the first IGBT Q1 from the capacitor C1. This means the time constant is clearly and strictly defined by resistor R1 and capacitor C1. In this design, the IGBT loading (e.g., capacitance Cge) is not considered as part of soft shut-down duration from time t2 to t3. Now the tuning of the time between t2 to t3 is independent of the IGBT. This effectively means the time between t2 and t3 will not depend on the IGBT, which makes implementation and design for applications much easier and predictable.

Figure 12:
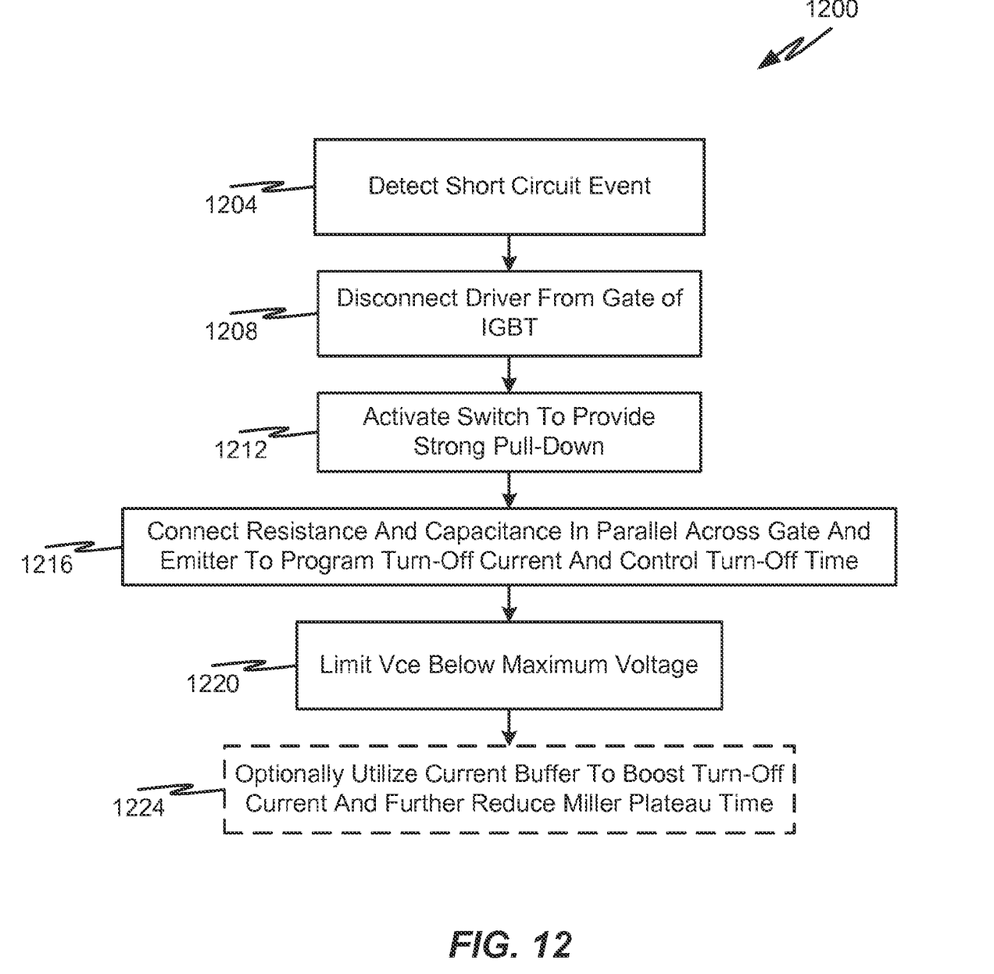
FIG. 12 is a flow diagram depicting a process for responding to a short-circuit event in accordance with embodiments of the present disclosure.

With reference now to FIG. 12, a method 1200 of detecting and responding to a short-circuit event will be described in accordance with at least some embodiments of the present disclosure. The method begins when a short-circuit event is detected (step 1204). The detection may occur with a short-circuit detection circuit 208 that includes a driver 204b or any other type of short-circuit detection circuit known in the art.

The method continues by disconnecting the driver (e.g., first driver 204a) that is driving the IGBT (e.g., the first IGBT Q1) (step 1208). Thereafter or simultaneous with step 1208 the switch M1 is activated to provide a strong pull-down to the IGBT (step 1212). Following the strong pull-down, the resistor R1 and capacitor C1 are connected across the gate G and emitter E of the IGBT to program the turn-off current and control the turn-off time (step 1216). Careful control of the turn-off current enables the short-circuit protection circuit 804 to limit the peak voltage Vce_peak below a predetermined voltage (e.g., a maximum operating voltage) (step 1220).

The method may further include the optional step of utilizing a current buffer Q3 to boost the turn-off current and further reduce the Miller plateau time (step 1224). In some embodiments, the current buffer Q3 may also provide a mechanism for decoupling the capacitor C1 from the IGBT, thereby making the turn-off time independent of the IGBT loading.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A circuit, comprising:
   at least one Insulated-Gate Bipolar Transistor (IGBT) having a gate, collector, and emitter;
   a first driver for the at least one IGBT, the first driver configured to provide a driving current to the gate of the IGBT;
   a load connected to the emitter of the at least one IGBT;
   a short-circuit protection circuit connected across the gate and the emitter of the at least one IGBT, wherein the short-circuit protection circuit is further connected to the first driver, wherein the short-circuit protection circuit comprises a switch to provide a strong pull-down to the at least one IGBT in response to detection of a short-circuit event in the circuit, and wherein the short-circuit protection circuit further comprises a capacitor and resistor that control a turn-off current provided to the gate of the at least one IGBT; and
   a current buffer connected across the switch and the at least one IGBT.

2. The circuit of claim 1, wherein the resistor and capacitor are connected in parallel with one another and each have a terminal connected to a first terminal of the switch.

3. The circuit of claim 2, wherein a second terminal of the switch is connected to the first driver and wherein a third terminal of the switch is connected to the emitter of the at least one IGBT.

4. The circuit of claim 3, wherein the resistor and capacitor also have terminals that connect directly to the gate of the at least one IGBT.

5. The circuit of claim 1, wherein the current buffer is connected across the gate and emitter of the at least one IGBT.

6. The circuit of claim 1, wherein the current buffer comprises a first terminal connected to the emitter of the at least one IGBT, a second terminal connected to both a terminal of the resistor and a terminal of the capacitor, and a third terminal connected to the emitter of the at least one IGBT.

7. The circuit of claim 1, wherein the current buffer comprises a transistor that boosts a turn-off current for the at least one IGBT and reduces a Miller plateau time for the at least one IGBT during the short-circuit event.

8. The circuit of claim 1, wherein the switch remains on after a peak voltage in the at least one IGBT is reached.

9. The circuit of claim 1, wherein the switch comprises an NPN transistor.

10. The circuit of claim 1, wherein the at least one IGBT comprises a first IGBT and a second IGBT configured in a half-bridge circuit configuration and wherein the short-circuit protection circuit is connected to an emitter of the first IGBT and connected to a collector of the second IGBT.

11. The circuit of claim 1, wherein the switch is turned on in response to the first driver being disconnected from the at least one IGBT.

12. The circuit of claim 1, wherein the short-circuit event corresponds to a condition where the emitter of the at least one IGBT is shorted to at least one of a common voltage and ground.

13. An Insulated-Gate Bipolar Transistor (IGBT) short-circuit protection circuit configured to protect an IGBT from damage during a short-circuit event, wherein the IGBT is driven by a driver and, in response to signals received from the driver, drives a load, and wherein the IGBT comprises a gate, collector, and emitter, the short-circuit protection circuit comprising:
   a switch configured to switch on during the short-circuit event and provide a route for current as an alternative to passing through the IGBT;
   a resistor having a first terminal and a second terminal, wherein the first terminal of the resistor receives current from a first circuit node connected to the gate of the IGBT, and wherein the second terminal of the resistor provides the current received from the first circuit node connected to the IGBT to the first terminal of the switch;
   a capacitor connected in parallel with the resistor; and
   a current buffer that is positioned between the gate of the IGBT and the combination of the resistor and capacitor.

14. The short-circuit protection circuit of claim 13, wherein the resistor and capacitor control a turn-off current provided to the gate of the IGBT.

15. The short-circuit protection circuit of claim 14, wherein the switch provides a strong pull-down to the IGBT in response to detection of the short-circuit event.

16. The short-circuit protection circuit of claim 13, wherein the second terminal of the resistor and the second terminal of the capacitor are both connected directly to the first terminal of the switch.

17. The short-circuit protection circuit of claim 16, wherein a second terminal of the switch receives a control signal from the driver and, in response to the control signal, closes a conduction path between the resistor, the capacitor, and the emitter of the IGBT.

18. The short-circuit protection circuit of claim 13, wherein the current buffer comprises a transistor that boosts a turn-off current for the IGBT and reduces a Miller plateau time for the IGBT during the short-circuit event.

19. A method of operating a short-circuit protection circuit, the method comprising:
  detecting an occurrence of a short-circuit event in a circuit comprising a driver, a short-circuit detection circuit, and an Insulated-Gate Bipolar Transistor (IGBT) having a gate, collector, and emitter;
  in response to detecting the occurrence of the short-circuit event, disconnecting the driver from the IGBT;
  also in response to detecting the occurrence of the short-circuit event, activating a switch in the short-circuit protection circuit to provide a strong current pull-down to the IGBT, wherein the strong current pull-down causes a Miller current to flow through the IGBT for an amount of time until an internal capacitance of the IGBT is fully charged and then causes a gate-to-emitter voltage of the IGBT to decrease at a predetermined rate;
  controlling the rate at which the gate-to-emitter voltage of the IGBT decreases with a resistor and capacitor connected between the gate of the IGBT and the switch such that an amount of time between when the Miller current is no longer flowing through the IGBT and the IGBT is fully turned-off is extended thereby decreasing a peak voltage provided to the IGBT; and
  utilizing a current buffer to boost a turn-off current of the IGBT.

20. The method of claim 19, wherein utilizing the current buffer to boost a turn-off current of the IGBT reduces an amount of time that the Miller current is provided to the IGBT.

* * * * *